United States Patent [19]

Ajioka

[11] Patent Number: 4,812,782

[45] Date of Patent: Mar. 14, 1989

[54] NON-REACTIVE RADIAL LINE POWER DIVIDER/COMBINER WITH INTEGRAL MODE FILTERS

[75] Inventor: James S. Ajioka, Fullerton, Calif.

[73] Assignee: Hughes Aircraft Company, Los Angeles, Calif.

[21] Appl. No.: 91,313

[22] Filed: Aug. 31, 1987

Related U.S. Application Data

[63] Continuation of Ser. No. 783,593, Oct. 3, 1985, abandoned.

[51] Int. Cl.[4] .......................... H03F 3/60; H03H 7/48

[52] U.S. Cl. .................................... 330/286; 330/287; 330/295; 333/125; 333/136; 333/21 A

[58] Field of Search ................. 330/286, 287, 295, 53, 330/56; 333/125, 127, 136, 21 A

[56] References Cited

U.S. PATENT DOCUMENTS

| | | | |
|---|---|---|---|
| 2,284,405 | 5/1942 | Mc Arthur | 330/56 X |
| 2,593,095 | 4/1952 | Brehm | 333/228 |
| 2,692,977 | 10/1954 | Koppel | 333/228 |
| 2,833,993 | 5/1958 | Riblet | 333/113 |
| 2,877,380 | 3/1959 | Esterson et al. | 315/39.16 |
| 2,916,659 | 12/1959 | Sege | 315/5.34 |
| 3,182,326 | 5/1965 | Cutler | 342/356 |
| 3,290,682 | 12/1966 | Ajioka | 343/368 |
| 3,775,694 | 11/1973 | Quine | 333/251 X |
| 3,958,247 | 5/1976 | Bogner et al. | 333/136 |
| 4,091,334 | 5/1978 | Sechi | 333/125 X |
| 4,175,257 | 11/1979 | Smith et al. | 330/287 |
| 4,189,683 | 2/1980 | Fassett et al. | 330/287 |
| 4,193,047 | 3/1980 | Carter et al. | 333/17 L |
| 4,234,854 | 11/1980 | Schellenberg | 330/286 |
| 4,238,747 | 12/1980 | Harp et al. | 333/228 |
| 4,263,568 | 4/1981 | Nemit | 333/127 |
| 4,371,845 | 2/1983 | Pitzalis, Jr. | 333/127 X |
| 4,641,106 | 2/1987 | Belohoubek | 330/286 |
| 4,641,107 | 2/1987 | Kalokitis | 330/286 |
| 4,700,145 | 10/1987 | Yelland et al. | 330/286 |

FOREIGN PATENT DOCUMENTS

| | | |
|---|---|---|
| 0020196 | 12/1980 | European Pat. Off. . |
| 0122084 | 10/1984 | European Pat. Off. . |
| 0123997 | 11/1984 | European Pat. Off. . |
| 1379009 | 12/1964 | France . |
| 2531274 | 2/1984 | France . |
| 887572 | 1/1962 | United Kingdom . |

OTHER PUBLICATIONS

J. S. Ajioka, H. A. Uyeda, "Experimental Performance of a Multimode Radial Transmission Line Beam Forming Network", *The Microwave Journal,* Dec. 1968, pp. 53–58.

J. S. Ajioka, "A Multiple Beam-Forming Network Using a Multimode Radial Transmission Line", *Nerem Record,* Tuesday, Nov. 5, 1963, pp. 54–55.

B. J. Sanders, "Radial Combiner Runs Circles Around Hybrids", *Microwaves,* Nov., 1980, pp. 55–58.

IEEE Transactions on Antennas & Propagation, vol. AP-33, No. 12 (Dec. 1985), "A Radial Line Slot Antenna for 12 GHz Satellite TV Reception".

International Search Report No. PCT/US 86/01934.

Kuno et al., "Hi-Power MM wave IMPATT Amplifiers"; Digest of Tech. Papers, 1973, IEEE, Int'l Solid State Circuit Conf.; Philadelphia, Pa.; 14–16, Feb. 1973; pp. 50–51.

*Primary Examiner*—Eugene R. LaRoche

*Assistant Examiner*—Benny T. Lee

*Attorney, Agent, or Firm*—Thomas A. Runk; Anthony W. Karambelas

[57] ABSTRACT

Disclosed is a parallel plate radial transmission line having parallel plate spacing of less than λ/2 and which utilizes a specific higher order mode, preferably the first higher order circumferential mode. Undesired modes are suppressed by mode supression slots formed in one or both of the parallel plates and which are oriented parallel to the current flow lines of the particular mode that is used. These slots have a negligible effect on the mode being used but they couple out other modes that are generated by means such as by imperfections and imbalances in any active devices coupled to the radial line. A centrally located feed is used to launch circularly polarized energy of the $TE_{11}$ mode in the particular circumferential mode in the radial line. The feed may also receive circularly polarized energy of the particular circumferential mode in the radial line, linearly polarize that received energy and conduct it in the $TE_{11}$ mode.

33 Claims, 4 Drawing Sheets

Fig. 1a.
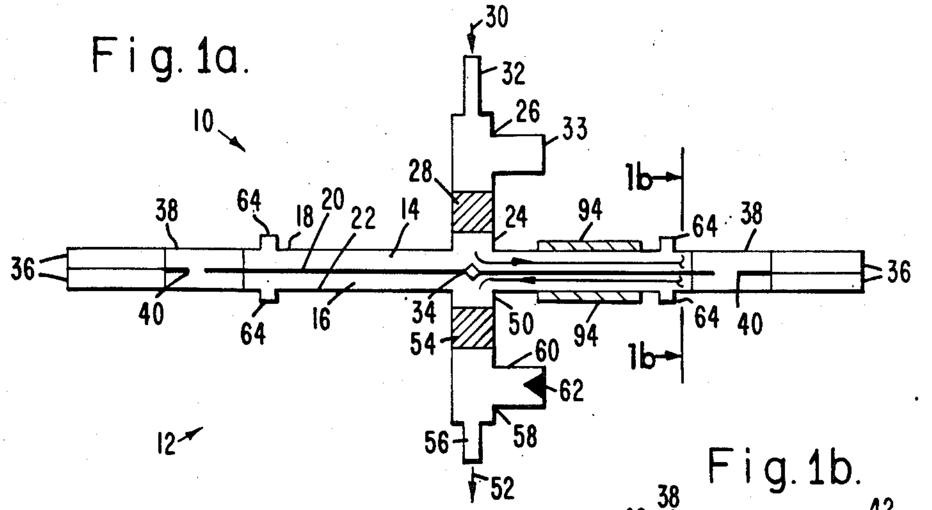
Fig. 1b.
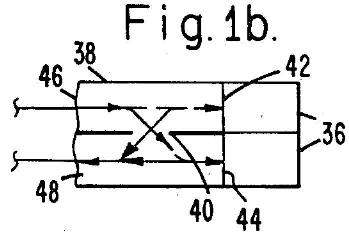
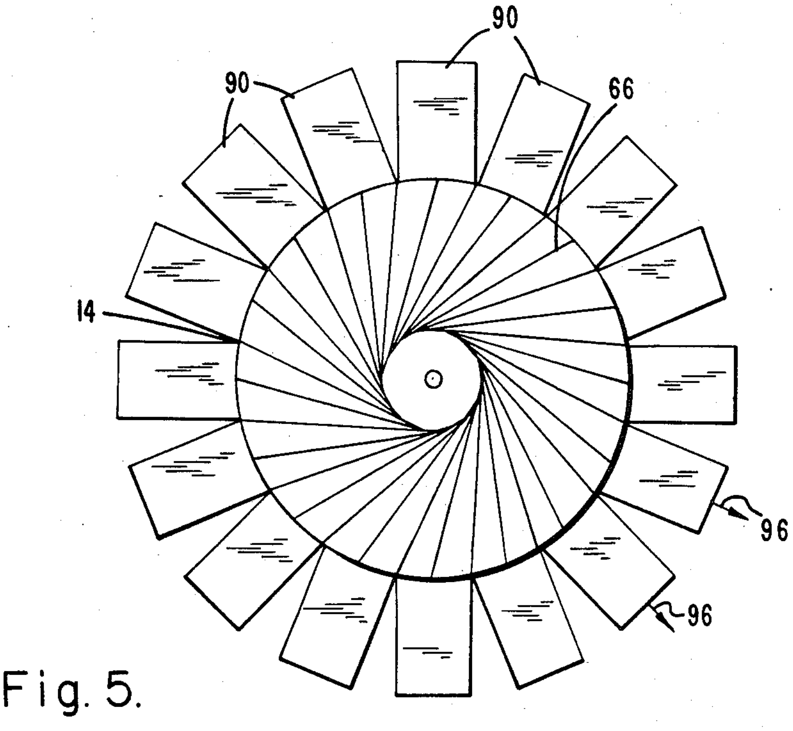
Fig. 5.

NON-REACTIVE RADIAL LINE POWER DIVIDER/COMBINER WITH INTEGRAL MODE FILTERS

This application is a continuation of application Ser. No. 783,593, filed Oct. 3, 1985.

BACKGROUND OF THE INVENTION

The invention relates generally to parallel plate radial line devices and more particularly, to non-reactive devices with mode filters.

Conventional power divider/combiners use branching transmission line networks that start from a single input port and branch out to N output ports (where N is the number of such ports) and vice versa for a combiner. Such networks are commonly known as corporate feeds. A corporate feed that uses simple three port T-junctions at each branch point is known as a reactive feed. As is well known, a three port junction is not impedance matched looking into all ports, (see Montgomery, Purcell and Dicke, MIT Rad. Lab. Series Vol. 8, *Principles of Microwave Circuits,* Chapter 9), hence, spurious reflections from any source such as at any other junction, connectors, bends etc. within the corporate feed or from any device at any of the outputs can cause large errors in the output amplitudes and phases and can cause resonances within the feed network. As a result, it can cause undesirable mutual coupling between the output devices, such as amplifiers, to result in spurious reflections or oscillations and high power breakdown. If each simple three port T-junction were replaced by a matched four port hybrid such as a magic-T or quadrature hybrid, there problems would be greatly alleviated because the spurious reflections are absorbed in the matched loads in the fourth port of the hybrid junction (see R. C. Johnson and H. Jasik, *Antenna Engineering Handbook,* Second Edition, pp. 20-55 through 20-56 and pg. 40-18).

A corporate feed using the above-described hybrid arrangement is typically quite complex, large, and costly because it contains on the order of N−1 hybrids, N−1 terminating loads, 2(N−1) bends and interconnecting transmission lines. It is also relatively lossy because, for cost purposes, the corporate feed is usually designed in stripline or microstrip which are very lossy compared to waveguide. Also, stripline and microstrip have not been able to handle high peak or high average powers.

The radial line power combiner is a type of non-reactive combiner for combining the outputs of a plurality of circumferentially mounted power sources in a single combining structure. Likewise, it is usable for dividing an input signal into a plurality of output signals in a single structure. By using two radial lines, one functioning as a powder divider and the other as a power combiner, a high power transmitting may be formed by coupling a plurality of individual power amplifying devices to the circumferences of both radial lines. However, in prior radial line techniques, the failure of an amplifier or amplifiers or the mismatching of a part of the radial line causes the generation of higher order modes with a decrease in radial line efficiency and power output.

A prior technique used to suppress higher order modes in a radial line involves mounting resistors at the circumference of the radial line between the power sources. This technique is difficult to implement at the higher frequencies such as millimeter wave where the resistor size is small, thus making it difficult to handle. Also the use of a discrete resistor may limit the power handling capability of the radial line.

Accordingly, it is an object of the invention to provide a radial line power divider/combiner which has the advantages of a radial line and which suppresses undesirable modes.

It is also an object of the invention to provide a radial line power divider/combiner which is able to handle relatively large power levels more efficiently.

SUMMARY OF THE INVENTION

The above objects and other objects are attained by the invention wherein there is provided a parallel plate, radial line power divider/combiner which, as a divider, has a means for launching circularly polarized, higher order mode energy through a centrally located port in the radial line, and has mode suppressing slots formed in one or both parallel plates of the radial line with associated absorption material for suppressing undesired modes. As a combiner, the radial line also has such mode suppressing slots formed in one or both parallel plates of the radial line and also has associated absorption material for suppressing undesired modes. Furthermore, the power combiner radial line has a centrally located means for coupling out the combined higher order mode power. Where required, a transformer, such as an annular groove, is used to impedance match the cylindrical waves of the radial line to an array of output waveguides or other coupling device at the circumference. If coaxial lines are used as the circumferential output ports of the radial line, the annular groove transformer is not necessary since impedance matching can be achieved with proper spacing of the coaxial probes into the radial line and proper positioning from the shorting cylinder that short circuits the parallel plates (see U.S. Pat. No. 3,290,682, J. S. Ajioka, "A Multiple Beam Antenna Apparatus," December 1966).

In accordance with the invention, a higher order circumferential mode is used, preferably the first higher order mode. In the radial line functioning as a power divider an input waveguide feed centrally located in one of the parallel plates is used to lauch circularly polarized $TE_{11}$ ($|m|=1$) mode ($m=+1$ for a left hand circularly polarized wave and $m=-1$ for a right hand circularly polarized wave) in a circular waveguide which, in turn, launches the $m=\pm 1$ mode in the radial line.

Mode suppression slots are formed in one or both parallel plates of the radial line for coupling undesired modes out. In the preferred embodiment, absorptive material is placed in or behind the slots to dissipate any such coupled power. In the principle of the invention, a mode of any order can be used and all other modes are suppressed by the slots formed in the parallel plate or plates of the radial line. The slots are oriented parallel to the current flow lines of the particular mode that is used and will have a negligible effect on that particular mode but will couple out others. The mode suppressing slots couple the spurious reflections mentioned above to the absorptive material to result in the electrical equivalent of a non-reactive corporate feed in which every junction is a matched hybrid.

In the radial line functioning as a power combiner in accordance with the invention, power input from positions on the circumference of the radial line is combined at a waveguide centrally located in one of the parallel plates which couples the combined, higher order mode energy to a circular polarizer. Mode suppression slots are also formed in one or both parallel plates of the radial line parallel to the current flow lines of the desired mode.

A radial line power divider/combiner is a traveling wave (non-resonant) combiner. In accordance with the invention, it utilizes a higher order circumferential mode, perferably the first higher order mode ($|m|=1$). The mathematically form for cylindrical modes in the radial line is $$e^{\pm jm\phi} H_m^{\binom{(1)}{(2)}}(kr)$$

where $e^{\pm jm\phi}$ indicates the circumferential phase progression and $H_m^{(2)}(kr)$ defines the outward radiating waves and $H_m^{(1)}(kr)$ defines the incoming waves (where H is the Hankel function, k is $2\pi/\lambda$ and r is the radial distance from the center). As discussed above, the mode suppression slots disposed in one or both parallel plates are oriented parallel to the current flow lines of the particular mode that is being used. The current flow lines are unique to each mode. To a very high degree of accuracy, the current flow lines for a given mode are straight lines tangential to an imaginary circle of m wavelengths in circumference having a center located on the centerline of the feed waveguide where m is the mode used. In accordance with the invention, the mode suppressing slots are concidental with these tangential lines. It is a well known principle that narrow slots located parallel to the RF current flow lines have very little effect on the wave; however, if the RF current has a component perpendicular to the slot, an electric field is generated across the slot and the slot could radiate this energy out of the structure is allowed. (See MIT Rad. Lab Series Vol. 12 *Microwave Antenna Theory and Design* edited by S. Silver, p. 286, Sec. 9.9). By placing absorbing material in the slot or in the region behind the slot, the coupled energy is absorbed.

Thus, the invention provides a relatively low cost, low loss, high power, and compact non-reactive power divider/combiner. The mode suppression slots make it the electrical equivalent of a conventional corporate feed power divider/combiner in which a four port hybrid such as a magic tee is used at each branch point in the corporate feed.

BRIEF DESCRIPTION OF THE DRAWINGS

The various features and advantages of the invention together with further features, advantages and objects thereof are described with more precision in the following detailed description taken in conjunction with the accompanying drawings, in which:

FIG. 1*a* is a schematic, block diagram of a crosssectional side view of two non-reactive radial line power divider/combiners in accordance with the invention showing two parallel plate radial transmission lines both with circular waveguide feeds centrally located in one of the circular parallel plates, the feeds having circular polarizers and orthomode transducers, and also showing hybrid couplers, and amplifiers located at the circumferences of the radial transmission lines;

FIG. 1*b* is an enlarged view of a part of FIG. 1*a* presenting in greater detail the function of the couplers and amplifiers attached to the radial line power divider/combiners;

FIG. 3*a* is the opposite sense of FIG. 3*b;*

FIG. 5 is a top view of a radial line in accordance with the invention showing the placement of mode suppression slots, the mode cutoff circle and a plurality of processing devices coupled at the circumference.

DETAILED DESCRIPTION OF THE INVENTION

Figure 2:
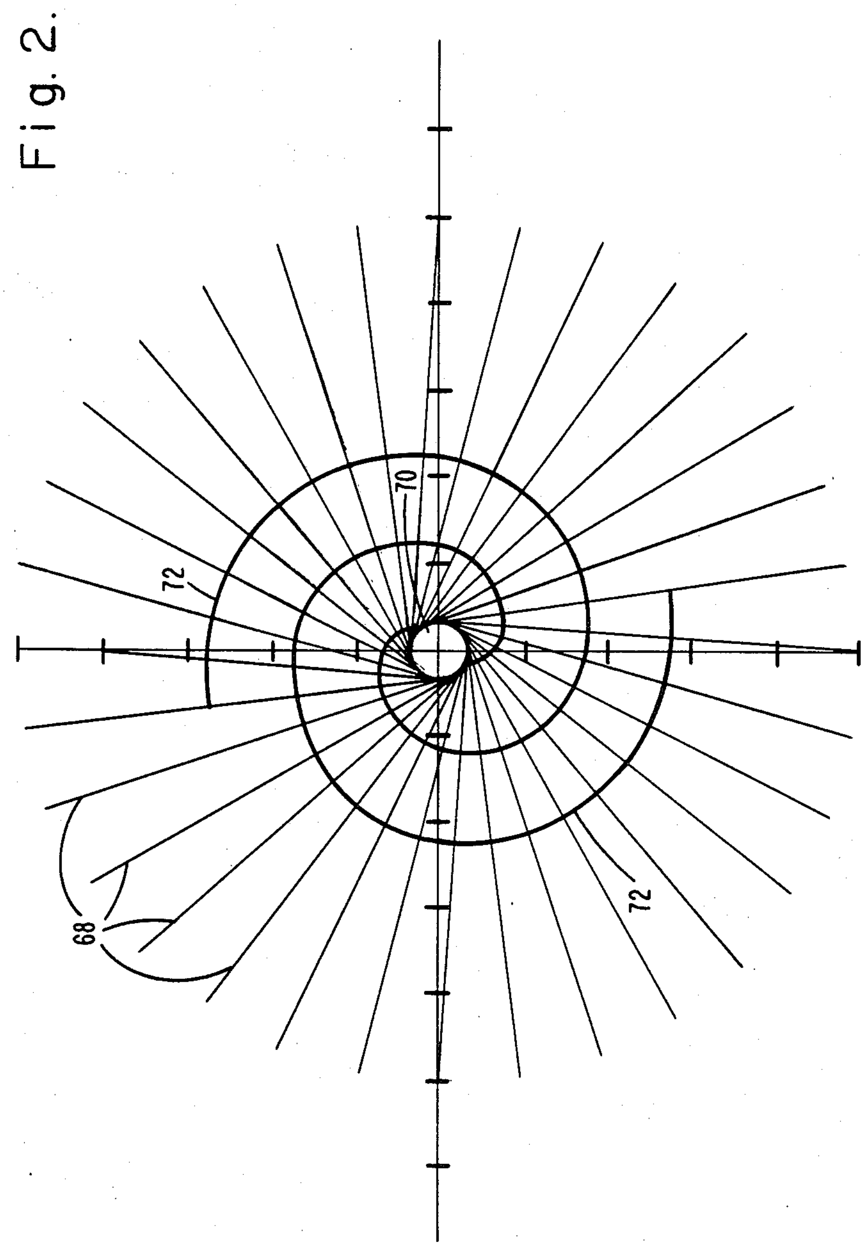
FIG. 2 is a rigorous computer plot of the mode cutoff circle, tangential current flow lines, and the equiphase contour which is shown as two spirals othogonal to the current flow lines.

Referring now to the drawings wherein like reference numerals designate like or corresponding elements among the several views, there is shown in FIG. 1a a block diagram representation of a pair of $m=1$ mode radial line power divider/combiners 10 and 12 in accordance with the invention. The upper radial line 10 functions as a power divider in this embodiment and includes a radial transmission line 14 for dividing applied energy. The lower radial line 12 functions as a power combiner and includes a radial transmission line 16 for combining amplified energy in this embodiment. Each radial transmission line 14, 16 has two parallel plates (18, 20 and 22, 20 respectively) where parallel plate 20 is a common plate in this embodiment. Each parallel plate is spaced apart from the adjacent plate by one-half wavelength or less. Circularly polarized energy is launched into the power divider radial transmission line 14 by a suitable means such as by a waveguide feed 24 with an orthomode transducer 26 and a circular polarizer 28. In the invention, a higher order circumferential mode is used and the input waveguide 24 is dimensioned to support that mode. For example, where the preferred first order mode $m=1$ is used, a circular waveguide 24 dimensioned to support the $TE_{11}$ mode is used. Energy 30 introduced into one port 32 of the orthomode transducer 26 is circularly polarized by the quarter wave plate circular polarizer 28, thus, the power divider radial transmission line 14 is circularly polarized. Energy introduced into the other port 33 of the orthomode transducer 26 would be circularly polarized in the opposite sense by the circular polarizer 28. A circular polarizer means usable in the invention may take the form of a quarter wave plate such as that shown or other types of circular polarizers known in the art.

As the relatively low power input energy 30 enters the power divider radial transmission line 14, it is divided equally around the radial transmission line 14 and is coupled to its circumference. In FIG. 1a, the matching device 34 may take the form of a conical object as shown or other shape. Also, other types of matching devices such as a tuning "button" known in the art may be usable.

Figure 4:
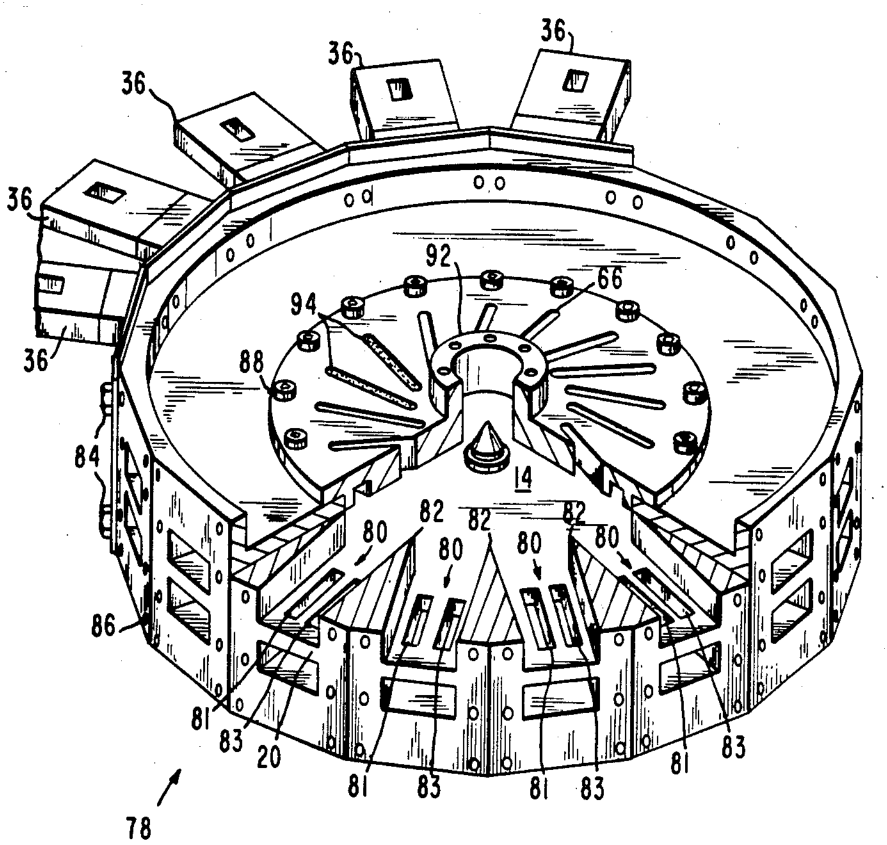
FIG. 4 is a partially cutaway perspective view of an embodiment of two non-reactive radial lines in accordance with the invention which have devices coupled at their circumferences to form a power amplifier. The radial lines, an input feed waveguide, circumferentially mounted waveguides having slots to form broadwall couplers, mode suppressing slots, and circumferential devices comprising directional couplers and amplifiers are shown.

In FIGS. 1*a* and 1*b*, there are shown in block form, amplifiers 36 and directional couplers 38 coupled to the radial transmission lines 14 and 16 at their circumferences. The amplifiers 36 may be of a reflective type and the directional couplers 38 may be of a type known in the art as 3 dB hybrid couplers. Shown in FIGS. 1*a* and 1*b* are 3 dB topwall hybrid couplers 38 which have two slots in a septum (one slot 40 is shown). As is known in the art, the size of the slots is chosen to achieve the amount of coupling desired. The couplers 38 shown are used in the embodiments of FIGS. 1*a*, 1*b* and 4 where there are two amplifiers 36 located at each circumferential position. Where a different arrangement is required, a different type of coupler may be used. In some applications, such as shown in FIG. 5, no coupler whatsoever may be required and the amplifier or other circumferential processing device used may be coupled directly to the circumference of the radial transmission line, or, in another case, waveguides may be used between the radial transmission line and the circumferential processing device as shown in FIG. 4.

Where reflective amplifiers are used, as the amplifiers 36 shown in FIGS. 1*a*, 1*b*, and 4, the incident low power enters the amplifier input/output port and the amplified high power leaves this same port; hence, it is equivalent to a reflection with a reflection coefficient greater than unity. Therefore, if two identical amplifiers 36 were coupled to two ports 42, 44 of a 3 dB hybrid directional coupler 38 as shown in FIG. 1*b*, the incident low power entering the hybrid coupler 38 through its input port 46 will be split in half (3 dB), input to both amplifiers 36 through the hybrid coupler amplifier ports 42, 44 and be reflected (with a reflection coefficient greater than unity—the gain of an amplifier) at each of the same ports 42, 44. Due to the nature of the hybrid coupler 38, these reflections will add in phase at its output port 48 and will cancel in phase at its input port 46 thereby causing the amplified power outputs of the amplifiers 36 to enter the combining radial transmission line 16 where they are combined in phase at the centrally located waveguide feed 50. As used herein, a feed is a means for conducting power to or from the radial line power divider/combiner. Commercially available broadwall hybrid couplers are suited for use as the direction coupler 38 described above.

The power combined in the power combiner radial transmission line 16 which is circularly polarized is converted to linearly polarized energy 52 by the circular polarizer 54 which is coupled to the output waveguide feed 50, and appears at one of the ports 56 of the orthomode transducer 58 also coupled to the output waveguide feed 50. Any residual power that is of the undesired oppositely rotating mode will appear in the orthogonal port 60 of the orthomode transducer 58 and can be absorbed by attaching a terminating load 62. The circular polarizer 54 used here may be the same type as that used in the power divider radial line 10. The output waveguide feed 50 is also dimensioned to support the desired mode, preferably the $TE_{11}$ mode.

In this embodiment shown in FIG. 1a, the power divider radial transmission line 14 is identical to the power combiner radial transmission line 16. Thus, a relatively low power input signal 30 is amplified and output as a relatively high power output signal 52 through the use of two "back-to-back" radial transmission lines 14 and 16 and amplifying processing means 38, 36 coupled to their circumferences. Also shown in FIGS. 1a and 4 are annular impedance matching grooves 64. These grooves 64 match the waves of the radial transmission lines 14, 16 to the directional couplers 38. Such matching means may not be required such as where coaxial probes are used instead of waveguide directional couplers. Matching is then accomplished by positioning the coaxial probes appropriately.

Imbalances in phase and/or amplitude among the amplifiers 36 (which are ideally identical) typically generate undesired modes in the radial line which can cause high coupling between the amplifiers 36 which, in turn, can cause spurious oscillation and damage to the amplifiers 36. As part of the invention, mode suppression slots are provided in one or both parallel plates of the radial transmission line. The mode suppression slots will couple out the power in the undesired modes into an absorption means and the desired isolation between amplifiers 36 will be maintained. A common situation is where an amplifier fails. This failure typically generates a larger number of undesired modes which can lead to the catastrophic results explained above. The mode suppression slots will perform as described to maintain isolation between the remaining amplifiers and allow continued operation.

Such mode suppression slots 66 are shown in FIGS. 3*a*, 3*b*, 4, and 5. They are oriented parallel to the current flow lines of the particular mode used. Since narrow slots have a negligible effect on parallel currents as discussed above but couple perpendicular components, the particular mode used will be affected very little by the parallel slots 66 while other modes will be coupled out of the radial transmission line. The inventor has found that the current flow lines for any particular circumferential mode are straight lines tangential to a mode cutoff circle which is a circle of "m" wavelengths in circumference, where m is the mode number, i.e., there are m.2π radians of phase change in going around the mode cutoff circle of a circumferential mode.

A rigorous computer plot of current flow lines 68 for the m=1 mode are shown in FIG. 2. The mode cutoff circle 70 is an imaginary circle of m-wavelengths in circumference and is called such because it has been found that the mode is cut off and does not propagate inside the circle 70. It may also be called the mode caustic circle because incoming rays (which are identical to the current flow lines 68) are tangent to this circle 70 which defines a caustic curve in geometrical optics. In FIG. 2, the numeral 68 has been used to point out only a few of the current flow lines to maintain clarity.

For +m, the tangential current flow lines are of one sense and for −m, the lines are of the opposite sense. A single sense is shown in FIG. 2 however FIGS. 3*a* and 3*b* which will be discussed in greater detail below, present both senses. It has also been found that constant phase contours 72 are orthogonal trajectories to the current flow lines 68 and form a spiral, the lines of which are spaced m.2π radians apart, as shown in FIG. 2 (two spirals 72 are shown). It is also interesting to note that the power flow lines (Poynting vector, $\bar{S}=\bar{E}\times\bar{H}$) are the same as the current flow lines 68 ($\bar{J}=n\times H$) where n is the unit normal vector to the plates) and since n and $\bar{E}$ are both normal to the plates, $\bar{S}$ and $\bar{J}$ are parallel. Thus constant phase contours 72 are normal to the power flow lines. The precise angle of the current flow lines 68 with respect to a radius is believed to be given by:

$$\tan\alpha = \frac{J_\phi}{J_n} = \frac{H_r}{H_\phi} = \frac{jm\lambda}{2\pi r} \frac{H_m^{(2)'}(kr)}{H_m^{(2)}(kr)}$$

where $J_\phi$=component of current in the $\phi$-direction $J_r$=radial component of current $H_r$=radial component of the magnetic field $H_\phi$=$\phi$-component of the magnetic field m=the mode number r=radial distance from the origin $k=2\pi/\lambda$ $H_m^{(2)}(kr)$ is the Hankel function correspondings outward traveling waves, $H_m^{(2)'}(kr)$ is the derivative of $H_m^{(2)}(kr)$ with respect to its argument kr.

It has been found that to a very high degree of accuracy, tan $\alpha$ is a real constant and equal to the geometrical tangents to a circle of m-wavelengths in circumference as shown in FIG. 2 (mode cutoff circle 70). Current distributions in waveguide usually given in the literature are a composite of +m and −m modes which are rather complex because they are interference patterns between the +m and −m current distributions. Mathematically, $$e^{jm\phi}+e^{-jm\phi}=2\cos m\phi \text{ or}$$

$$e^{jm\phi}-e^{-jm\phi}=2j\sin m\phi$$

where cos$m\phi$ or sin$m\phi$ are "standing wave" expressions in the $\phi$-coordinate which is a combination $e^{+jm\phi}$ and $e^{-jm\phi}$, which are each "traveling wave" expressions of waves traveling in opposite directions in the $\phi$-coordinate. Waves of equal amplitude traveling in opposite directions constitute a standing wave. Thus, the invention is directed to operation on the traveling wave, as opposed to prior techniques which operate on the standing wave.

Figure 3A:
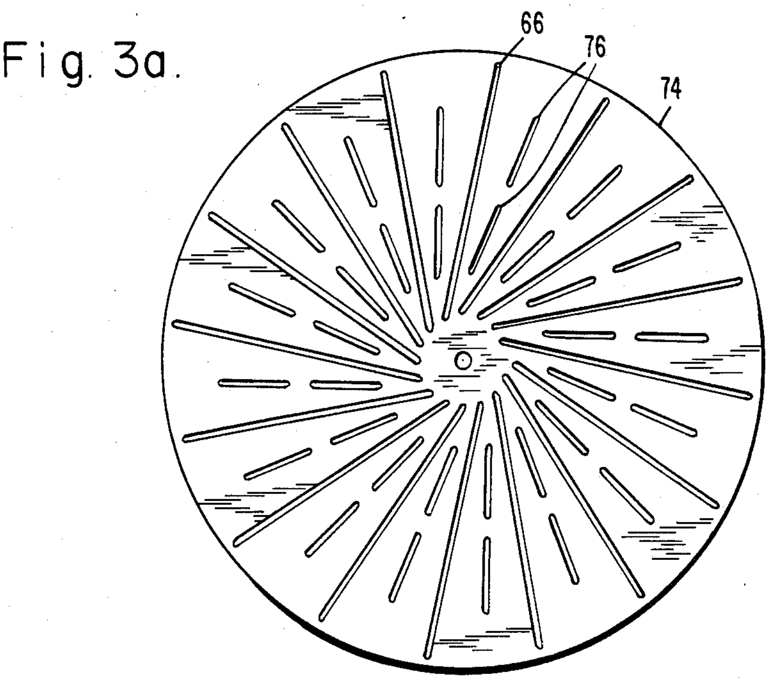
FIGS. 3*a* and 3*b* are diagrams showing the orientation and shape of mode suppression slots in accordance with the invention where
Figure 3B:
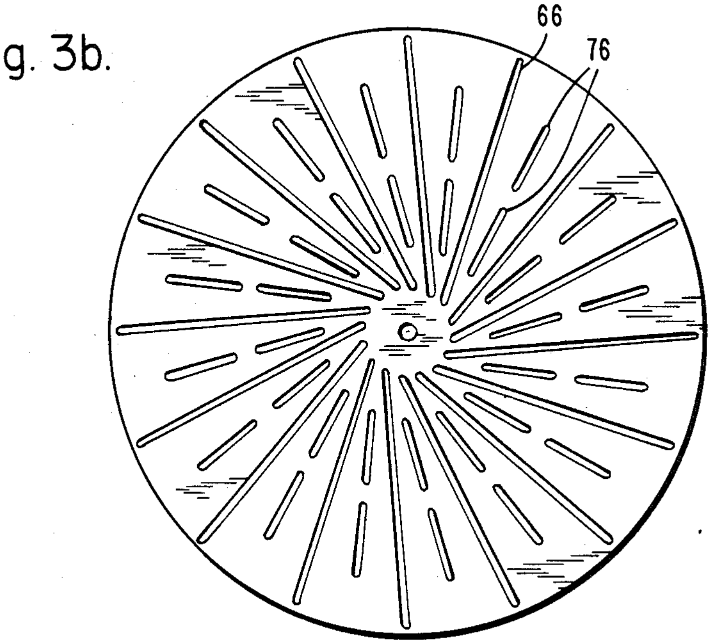

A mode suppression slot arrangement in accordance with the invention is shown in FIGS. 3*a* and 3*b*. In one embodiment, such as where a radial transmission line in accordance with the invention is used as a power divider, both parallel plates would be slotted as is plate 74 in FIG. 3*a*. As is shown, the slots 66 are oriented such that they are coincidental with tangents to a mode cutoff circle 70 (FIG. 2). Two types of slots are shown in FIGS. 3*a* and 3*b*, a continuous slot 66 and an interrupted slot 76. While these slots 66, 76 are shown as alternating, other embodiments are possible. These figures are not meant to be exhaustive of the types of slots configurations usable in the invention and other configurations are possible.

In FIG. 3*a*, slots of one sense are shown and in FIG. 3*b*, slots of the opposite sense are shown. Depending upon the direction of energy rotation in the radial transmission line, both parallel plates of the radial transmission line power divider in accordance with the invention may have slots oriented as in FIG. 3*a*. If the direction of rotation is opposite, both parallel plates would be slotted as in FIG. 3*b*. However, in the case where one parallel plate is common to two radial transmission lines and each radial transmission line conducts energy rotating with different senses, the common plate cannot be slotted as in either FIG. 3*a* or 3*b* since the energy of a sense having a component perpendicular to the slot will couple out of that radial line and into the other. Thus the common parallel plate is unslotted. This situation would apply to the embodiments shown in FIGS. 1*a*, 1*b*, and 4.

In the embodiments of FIGS. 1*a*, 1*b*, and 4, two "back-to-back" radial transmission lines 14, 16 are used to combine the power of N reflective type amplifiers 36 (where N=the number of amplifiers) such as IMPATT diode amplifiers or phase locked oscillators. One radial transmission line 14 divides and distributes the relatively low power input energy 30 to the N power amplifiers 36 and the other radial transmission line 16 combines the higher power output energy of the N amplifiers; hence, there is a relatively low power divider and a relatively high power combiner with a common parallel plate 20. In this back-to-back embodiment, mode suppression slots 66,76 are formed only in the outer parallel plates 18, 22 which are not common to the two radial transmission lines 14, 16.

In FIG. 4 there is presented a perspective, partially cutaway view of an embodiment of the invention as a power divider/combiner 78 which functions as an amplifier. A microwave radial line power divider/combiner 78 is shown using two back-to-back parallel plate radial transmission lines as schematically shown in FIG. 1. In FIG. 4, the two radial transmission lines with circumferential waveguides 80 have been formed as a single structure. The vanes 82 are part of the structure and define the waveguides 80 to which the amplifiers 36 are coupled. In this embodiment, the waveguides 80 have been formed into 3 dB broadwall couplers such as that shown in FIG. 1 by forming two appropriate slots 81 and 83 in each waveguide region 80 of the parallel plate 20 which is common to both radial transmission lines. This allows the amplifiers 36 to be directly connected to these ports on the circumferences formed by the waveguides 80. As shown in FIG. 4, the amplifiers 36 are attached to the circumferences of the radial transmission lines and waveguides 80 by means of inserting screws 84 through the mounting flange of the amplifier 36 and into screw holes 86.

Also shown in FIG. 4 is a slotted plate 88 similar to those shown in FIGS. 3*a* and 3*b* which covers the radial transmission line 14. In the embodiment of FIG. 4, the slots 66 extend only over the radial line portion of the structure. In other embodiments, these slots 66 may continue over the waveguides 80 to provide continued mode suppression. As shown in FIG. 5, the mode suppression slots 66 continue to the circumference of the radial transmission line 14 where a plurality of processing devices 90 are attached.

In the embodiment of FIG. 4, the slotted plate 88 is removable however this need not be the case. Also shown is an input circular waveguide and flange 92 to which an input signal power source may be connected. The size of the input waveguide is such that it supports the desired higher order mode and as such, is typically larger than the mode cutoff circle 70 (FIG. 2).

As previously discussed, FIG. 4 presents an embodiment where reflective amplifiers 36 are used. By using the 3 dB broadwall coupler formed by the two slots 81 and 83, two reflective amplifiers 36 are used at each circumferential position as shown more clearly in FIG. 1*a*. This arrangement has two advantages, the first is that twice as many amplifiers can be combined without enlarging the entire package and the second is that the hybrid arrangement alleviates the high isolation requirements of circulators which are normally associated with each amplifier in prior techniques and which may even be eliminated entirely. Although it has been described above that waveguide sections with 3 dB broadwall coupling slots can be used in an embodiment of the invention, they need not be used in other embodiments. However they have been found to have the advantages of low loss and high power handling capability.

Energy coupled out of the radial transmission line by the mode suppression slots may be absorbed by an RF lossy material. In FIG. 4, some of the mode suppression slots 66 are shown as being filled with an RF lossy material 94 such as Eccosorb made by Emerson & Cuming, Inc., having an address of Gardena, Calif. 90248. The slotted plate 88 may also be painted with an RF absorptive paint. Other means for absorbing the slot coupled energy or conducting it elsewhere may be used such as placing an RF lossy material 94 over the slots on the outer plates 18 and 22 as shown in FIG. 1a.

Thus, there has been disclosed a new and improved non-reactive radial line power divider/combiner. This radial line power divider/combiner has the advantages of radial transmission lines and due to the improvements of the invention, additionally suppresses undesired modes without degradation of its power handling capability. As is well known to those skilled in the art, an advantage of the radial line is the ability to adjust its size to accommodate an increase in the number of circumferentially mounted devices. The circumference of the radial line is merely enlarged to accommodate more devices.

Although the invention has been described and illustrated in detail, this is by way of example only and is not meant to be taken by way of limitation. For example, in FIGS. 1 and 4, the radial line is shown in an embodiment where there are two such radial lines joined by a common parallel plate 20 and having directional couplers 38 and reflective amplifiers 36 attached at the circumferences. Furthermore, FIG. 4 shows the use of waveguides between the radial line and the circumferentially attached directional couplers 38. Other embodiments of the invention are possible, such as that shown in FIG. 5 where a single radial transmission line 14 is used with circumferentially attached processing devices 90. These devices 90 may be amplifiers and their outputs may be conducted elsewhere as shown by the arrows 96. In this case, the radial line would function as a power divider with no waveguides or directional couplers between it and the amplifiers 90. Slots may be formed in both parallel plates of this radial line 14 which are spaced from each other one-half or less of the wavelength of the energy. Where reflections or oscillations are generated in the radial line 14, the mode suppression slots 66 will couple them out.

Modifications to the above description and illustrations of the invention may occur to those skilled in the art, however, it is the intention that the scope of the invention should include such modifications unless specifically limited by the claims.

What is claimed is:

1. A radial line power divider operating in a circumferential mode m, where the absolute value of m is a value of at least one comprising:

a radial transmission line for dividing applied energy, comprising first and second circular, electrically conductive plates spaced from each other by less than half of the wavelength of the input energy in parallel relation, the first circular plate comprising port means centrally located therein through which the input energy is applied;

feed means at said port means for launching energy in said mode m into the radial transmission line causing current flow in lines tangential to a mode cut off circle of m wavelengths in circumference, said current flow lines extending from said circumference to the periphery of said plates, said mode cut off circle having its center in said port; and at least one slot formed in at least one of said parallel plates, said slot having a longitudinal centerline which is parallel to at least one current flow line of the m circumferential mode energy in said radial transmission line;

whereby said at least one slot suppresses modes other than m from the energy output of the radial transmission line.

2. The radial line power divider of claim 1 wherein the feed means comprises:

a $TE_{11}$ mode waveguide coupled to the centrally located port through which the applied energy may be conducted to the radial transmission line; and a polarizing means for circularly polarizing the energy conducted through the waveguide.

3. The radial line power divider of claim 1 having at least one slot formed in each of the plates.

4. The radial line power divider of claim 1 wherein said at least one slot is oriented such that its longitudinal centerline is coincidental with one of said current flow lines.

5. The radial line power divider of claim 1 further comprising absorption means for absorbing energy coupled by said at least one slot.

6. The radial line power divider of claim 5 wherein the absorption means is disposed in said at least one slot.

7. The radial line power divider of claim 5 wherein the absorption means is disposed over said at least one slot at a location outside of said radial transmission line.

8. A radial line power combiner for combining applied energy of a circumferential mode m, where the absolute value of m is a value of at least one comprising:

a radial transmission line comprising first and second electrically conductive plates spaced from each other by less than half of the wavelength of the applied energy in a parallel relation and defining a periphery at which the energy is applied, the first plate comprising port means centrally located therein through which the combined energy is output;

feed means at said port means for receiving energy in said mode m from the radial transmission line having current flowing therein in lines tangential to a mode cut off circle of m wavelengths in circumference, said current flow lines extending to said circumference from the periphery of said plates, said cut off circle having its center in said port, and for linearly polarizing the received energy; and at least one slot formed in at least one of said parallel plates, said slot having a longitudinal centerline which is parallel to at least one current flow line of the m circumferential mode energy in said radial transmission line;

whereby said at least one slot suppresses modes other than m form the energy combined in said port.

9. The radial line power combiner of claim 8 wherein the feed means comprises:

a $TE_{11}$ mode waveguide coupled to the centrally located port through which the received, combined energy may be output from the radial transmission line; and a polarization means for linearly polarizing the energy conducted through the waveguide.

10. The radial line power combiner of claim 8 having at least one slot formed in each of the plates.

11. The radial line power combiner of claim 8 wherein said at least one slot is oriented such that its longitudinal centerline is coincidental with one of said current flow lines.

12. The radial line power combiner of claim 8 further comprising absorption means for absorbing energy coupled by said at least one slot.

13. The radial line power combiner of claim 12 wherein the absorption means is disposed in at least one slot.

14. The radial line power combiner of claim 12 wherein the absorption means is disposed over said at least one slot at a location outside said radial transmission line.

15. A radial line power divider/combiner operating in a circumferential mode m, where the absolute value of m is a value of at least one comprising:

a first radial transmission line for dividing applied energy comprising first and second electrically conductive plates spaced from each other by less than half of the wavelength of the input energy in a parallel relation, the first plate comprising a first port centrally located therein through which the input energy is applied;

first feed means at said first port for launching the applied energy in said mode m into the first radial transmission line causing current flow in said first radial transmission line in lines tangential to a mode cut off circle of m wavelengths in circumference, said current flow lines extending from said circumference to the periphery of said plates, said mode cut off circle having its center in said port;

a second radial transmission line for combining energy comprising third and fourth electrical conductive plates spaced from each other by no more than half the wavelength of the input energy in a parallel relation, the third circular plate comprising a second port centrally located therein through which the combined energy is output;

second feed means at said second port for receiving and combining energy in said mode m from the second radial transmission line, having current flowing therein in lines tangential to a mode cut off circle of m wavelengths in circumference, said current flow lines extending to said circumference from the periphery of said plates, said mode cut off circle having its center in said second port, and for linearly polarizing the received energy;

processing means for processing energy received from the first radial transmission line at its periphery and applying the processed energy to the second radial transmission line at its periphery;

at least one slot formed in at least one of said parallel plates in each of the radial transmission lines, said slots each having longitudinal centerlines which are parallel to at least one current flow line of the m circumferential mode energy in the respective radial transmission line;

whereby said at least one slot in the first radial transmission line suppresses modes other than m from the energy output of the radial transmission line and the at least one slot in the second radial transmission line suppresses modes other than m from the energy combined at said second port in the second radial transmission line.

16. The radial line power divider/combiner of claim 15 wherein:

the first feed means comprises a first $TE_{11}$ waveguide coupled to the centrally located port of the first radial transmission line for applying the energy and circular polarizing means for circularly polarizing energy conducted by the first waveguide; and the second feed means comprises a second $TE_{11}$ waveguide coupled to the centrally located port of the second radial transmission line for outputting the combined energy and linearly polarizing means for linearly polarizing energy conducted by the second waveguide.

17. The radial line power divider/combiner of claim 15 wherein the processing means comprises a plurality of amplifiers to which the energy received from the first radial transmission line is coupled by the processing means and from which the amplified energy is coupled to the circumference of the second radial transmission line by the processing means.

18. The radial line power divider/combiner of claim 17 wherein the processing means comprises a plurality of unidirectional couplers which are coupled to the peripheries of both radial lines and to the plurality of amplifiers and which couple energy received at the periphery of the first radial line substantially in one direction to the amplifiers and which couple the amplified energy from the amplifiers substantially in one direction to the second radial line at its periphery.

19. The radial line power divider/combiner of claim 18 wherein the plurality of amplifiers are disposed around the peripheries of the radial transmission lines in such a way that there are two amplifiers at each periphery position.

20. The radial line power divider/combiner of claim 19 wherein the couplers comprise four ports, one of which is an input port which is coupled to the first radial transmission line at its periphery for receiving the divided energy, a second port being an output port which is coupled to the second radial transmission line at its periphery for applying the amplified energy thereto, and the third and fourth ports being coupled to the two amplifiers respectively, where energy received by the input port is divided and substantially unidirectionally applied to the two amplifiers, where energy received by the output port from the two amplifiers is combined and substantially unidirectionally applied to the second radial transmission line at its periphery and the third and fourth ports conduct energy and amplified energy to and from the amplifiers respectively.

21. The radial line power divider/combiner of claim 20 wherein the directional couplers are 3 dB couplers and function such that they split power entering through the input port from the first radial transmission line substantially in half and conduct half of the split power to one amplifier and half to the second amplifier.

22. The radial line power divider/combiner of claim 21 wherein the directional couplers comprise 3 dB waveguide topwall couplers.

23. The radial line power divider/combiner of claim 15 wherein the second plates of both radial transmission lines are the same plate.

24. The radial line power divider/combiner of claim 15 wherein at least one of said slots is oriented such that its longitudinal centerline is coincidental with one of said current flow lines.

25. The radial line power divider/combiner of claim 26 wherein said absorption means is disposed in said at least one slot.

26. The radial line power divider/combiner of claim 15 further comprising absorption means for absorbing energy coupled by said at least one slot.

27. The radial line power divider/combiner of claim 26 wherein said absorption means is disposed over said at least one slot at a location outside of said radial transmission line.

28. The electrically conductive plate for use in a radial transmission line, said plate including centrally located port means through which energy can input or output, said plate having at least one slot formed therein with the longitudinal centerline of said at least one slot parallel to at least one current flow line of m circumferential mode energy when electrical current flow across said plate is in lines tangential to a mode cut off circle of m wavelengths in circumference, with said lines extending from said circumference to the periphery of said plate, and said mode cut off circle has its center in said port.

29. The electrically conductive plate of claim 28 wherein said plate is circular in shape and said port is also circular in shape.

30. The electrically conductive plate of claim 28 wherein said at least one slot is sufficiently narrow to minimize the coupling of current flowing in lines parallel to said at least one slot.

31. The electrically conductive plate of claim 28 wherein said at least one slot is continuous.

32. The electrically conductive plate of claim 28 wherein said at least one slot is an interrupted slot.

33. The electrically conductive plate of claim 28 wherein said at least one of said slots is continuous and at least one is an interrupted slot.

* * * * *